(12) United States Patent
Pfaffinger et al.

(10) Patent No.: US 11,523,553 B2
(45) Date of Patent: Dec. 6, 2022

(54) METHOD AND CONTROL DEVICE FOR THE PROCESSING-TIME-OPTIMIZED PRODUCTION OF PRINTED CIRCUIT BOARDS ON A PICK-AND-PLACE LINE

(71) Applicant: Siemens Aktiengesellschaft, Munich (DE)

(72) Inventors: Alexander Pfaffinger, Munich (DE); Christian Royer, Ottobrunn (DE)

(73) Assignee: SIEMENS AKTIENGESELLSCHAFT

( * ) Notice: Subject to any disclaimer, the term of this patent is extended or adjusted under 35 U.S.C. 154(b) by 391 days.

(21) Appl. No.: 16/629,726

(22) PCT Filed: Jul. 11, 2017

(86) PCT No.: PCT/EP2017/067363
§ 371 (c)(1),
(2) Date: Jan. 9, 2020

(87) PCT Pub. No.: WO2019/011412
PCT Pub. Date: Jan. 17, 2019

(65) Prior Publication Data
US 2021/0092886 A1 Mar. 25, 2021

(51) Int. Cl.
*H05K 13/08* (2006.01)
*G06Q 10/06* (2012.01)
*G06Q 50/04* (2012.01)

(52) U.S. Cl.
CPC ..... *H05K 13/0857* (2018.08); *G06Q 10/0633* (2013.01); *G06Q 50/04* (2013.01)

(58) Field of Classification Search
CPC ........... G06Q 10/00–50/00; H05K 1/00–13/00
(Continued)

(56) References Cited

U.S. PATENT DOCUMENTS 6,289,582 B1 * 9/2001 Maenishi ............. H05K 13/085
29/832
10,750,651 B2 * 8/2020 Wernet ............... H05K 13/0404
(Continued)

FOREIGN PATENT DOCUMENTS

CN 1742529 A 3/2006
CN 1846223 A 10/2006
(Continued)

OTHER PUBLICATIONS

ASM Assembly Systems, http://www.siplace.com/en/Home, Mar. 10, 2016.
(Continued)

*Primary Examiner* — Alan S Miller
(74) *Attorney, Agent, or Firm* — Schmeiser, Olsen & Watts LLP

(57) ABSTRACT

Provided is a transmission device for feedback-free unidirectional transmission of data from a first network zone into a second network zone for evaluation at a remote application server, containing: —a data export device which is arranged in the first network zone and is to detect the data transmitted in a network data format in the first network zone and to transform the data from the network data format into a transport data format, —a unidirectional data transmission unit, to transmit the data in the transport data format into the second network zone unidirectionally—a data import device which transforms the data from the transport data format back into the network data format and to transmit the data to an application server, wherein the data import device and the application server are arranged in a second network zone remote from the first zone, and to a corresponding method.

20 Claims, 2 Drawing Sheets

(58) Field of Classification Search
USPC .............................. 700/1–90; 705/7.11–7.42
See application file for complete search history.

(56) References Cited

U.S. PATENT DOCUMENTS

| | | | |
|---|---|---|---|
| 2004/0073322 A1* | 4/2004 | Maenishi | H05K 13/085 700/28 |
| 2006/0052893 A1 | 3/2006 | Yamazaki et al. | |
| 2006/0229758 A1 | 10/2006 | Maenishi et al. | |
| 2010/0064511 A1 | 3/2010 | Maenishi | |
| 2013/0190913 A1* | 7/2013 | Lamparter | G06Q 10/08 700/99 |
| 2015/0160648 A1* | 6/2015 | Craiovan | H05K 13/085 700/121 |
| 2015/0195965 A1 | 7/2015 | Craiovan et al. | |
| 2015/0301523 A1 | 10/2015 | Fukao | |
| 2016/0037693 A1 | 2/2016 | Kurashina et al. | |
| 2016/0360657 A1 | 12/2016 | Oyama | |
| 2017/0311491 A1* | 10/2017 | Pfaffinger | H05K 13/08 |
| 2017/0318716 A1* | 11/2017 | Pfaffinger | G05B 19/4097 |
| 2018/0101161 A1 | 4/2018 | Yasui et al. | |

FOREIGN PATENT DOCUMENTS

| | | |
|---|---|---|
| CN | 101536626 A | 9/2009 |
| CN | 104396362 A | 3/2015 |
| CN | 104584710 A | 4/2015 |
| CN | 105144862 A | 12/2015 |
| CN | 106030769 A | 10/2016 |
| DE | 19834620 A1 | 3/1999 |
| DE | 102012221258 A1 | 5/2014 |
| DE | 102014222936 A1 | 5/2016 |
| DE | 102014222940 A1 | 5/2016 |
| WO | 2016151833 A1 | 9/2016 |
| WO | 2018141356 A1 | 8/2018 |

OTHER PUBLICATIONS http://www.wirtschaftslexikon24.com/d/littlesches-gesetz/littlesches-gesetz.htm.
PCT International Search Report and Written Opinion of International Searching Authority dated Mar. 21, 2018 corresponding to PCT International Application No. PCT/EP2017/067363.
Chinese Notice of Allowance for Application No. 201780093061.9, dated May 8, 2021.
Non-English Chinese Office Action for Application No. 201780093061.9, dated Sep. 15, 2020.

* cited by examiner

METHOD AND CONTROL DEVICE FOR THE PROCESSING-TIME-OPTIMIZED PRODUCTION OF PRINTED CIRCUIT BOARDS ON A PICK-AND-PLACE LINE

CROSS-REFERENCE TO RELATED APPLICATIONS

This application claims priority to PCT Application No. PCT/EP2017/067363, having a filing date of Jul. 11, 2017, the entire contents of which are hereby incorporated by reference.

FIELD OF TECHNOLOGY

The following relates to a method for the processing-time-optimized production of printed circuit boards on a pick-and-place line. Embodiments of the invention further relate to a control device for a pick-and-place system or a fabrication or assembly line for the assembly of printed circuit boards or assemblies with components or devices. Embodiments of the invention also relate to a computer program product.

BACKGROUND

In particular in the area of electronics production, printed circuit boards or assemblies to be fabricated are produced on SMT pick-and-place lines by surface mounted technology (SMT). One manufacturer of automatic SMT pick-and-place machines and systems having the product name SIPLACE is, for example, the company ASM (http://www.siplace.com/en/Home).

Several automatic pick-and-place machines, which are usually connected by a transport system and which, for example, cooperate to fabricate or to produce (electronic) components or printed circuit boards, form a pick-and-place line.

In automatic pick-and-place machines, e.g. for assembling assemblies with components, shuttle tables for supply devices for components are arranged laterally on a transport section for the assembly.

The shuttle tables each comprise a plurality of feed devices. Each feed device holds in readiness a supply of components of a predetermined component type. For the components the feed device has a capacity (place capacity), which is usually expressed in tracks or track capacities.

Each feed device can be configured to hold in readiness different components and usually different feed devices can be attached to a shuttle table. If a component of a component type is required for a specific automatic pick-and-place machine, which is not present in one of the shuttle tables, usually one of the attached shuttle tables is not therefore provided with the required components but is completely exchanged for another suitably fitted shuttle table. The setting up of a shuttle table to be exchanged with components is called preliminary setup and can require a processing time within the range of hours.

Furthermore, for example, it is known from electronics fabrication to combine the batches to be fabricated on one pick-and-place line in setup families. All batches of one setup family are each fabricated with the same line setup. A setup family, also called cluster, comprises a quantity of batches which can be fabricated within one setup. All assemblies of one setup family can therefore be fabricated successively on the pick-and-place line without modifying.

In this case, each assembly has a cycle time of, for example, one-time unit 1, 2, 3 etc. in production or fabrication.

When considering FIG. 1, a pick-and-place line 110 with two automatic pick-and-place machines 130 is shown. Another such automatic pick-and-place machine on the pick-and-place line 110 is feasible. Then with three such automatic pick-and-place machines on a pick-and-place line, the production time of a printed circuit board 120 at the end of the pick-and-place line would be 30 seconds when the cycle time of an assembly on an automatic pick-and-place machine is 10 seconds. The cycle time is therefore expressed such that every 10 seconds a further assembly comes out fabricated at the end of the pick-and-place line.

A setup can be held on one or more setup tables, which can easily be exchanged on the automatic pick-and-place machine. However, a setting up of a setup table with components of predetermined component types is time-consuming—as already described above. The setups are therefore frequently distinguished into fixed setups and variant setups, wherein a fixed setup table is provided to maintain its composition of component types over a predetermined planning time interval while a variant setup table is prospectively modified within the planning time.

The typical setup operation on an SMT pick-and-place line within a short-term planning period, beginning with the planning as far as the execution looks as follows: the duration of a short-term planning period is normally between one and five days. At the beginning of a planning period, the production planner usually receives new fabrication orders from an EDP system. However, he also still has a remainder of old, not yet planned fabrication orders from the previous period. The orders are fabricated, if possible, with existing fixed setups. Variable setups (also called variant setups) are created for the remainder.

While assembly is carried out with an active setup on the pick-and-place line, in the preliminary setup area the next setup is already being prepared on a shuttle table set held in readiness for variable setups. A quantity of shuttle tables required per setup is here designated as shuttle table set. If the preparation takes too long, this results in a downtime of the pick-and-place line.

Modification processes for changing the setup from one setup family to another setup family involve downtimes of typically 30 min.

Downtimes reduce the throughput on the pick-and-place lines and should therefore be avoided at all costs.

In practice, the variable setups are usually created with a cluster tool such as, for example, SiCluster. The setup order ordered in a time sequence in the preliminary setup area is presently created manually by the production planner.

A method or a control device, which optimizes the throughput on a pick-and-place line, has already been proposed from PCT/EP2017/051997.

The throughput is not the only important characteristic for operation of an pick-and-place line. Another is the processing time, which is a central quantity in value stream theory/lean manufacturing.

The processing time in the said environment relative to an order comprises the period from the transfer to the fabrication area until completion. The processing time of an individual assembly/printed circuit board is understood as the period from the transfer of the corresponding fabrication order to the fabrication area as far as completion.

The components of the processing time include not only the pure fabrication times on the individual automatic pick-and-place machines but also (modification) setup and transport times. Furthermore, the waiting times upstream of the automatic pick-and-place machines (and possibly the final waiting time after the last assembly) are an essential component (possibly up to 90%) of the processing time.

Little's law gives the relationship of throughput and processing time (http://www.wirtschaftslexikon24.com/d/littleschesgesetz/littlesches-gesetz.htm):

$$DLZ = \frac{WIP}{Throughput}$$

wherein:
DLZ: mean processing time [time]
WIP: mean stock of parts in the production system (work in progress) [item]
Throughput: mean rate of production of parts leaving the production system [item/time]

By maximizing the throughput (reducing the waiting times) the processing time is also reduced.

For the same throughput however, the processing time and therefore the (inventory) stock can be reduced by additional optimization.

SUMMARY

An aspect relates to improve the processing time on a pick-and-place line.

Embodiments of the invention comprise a method for the processing-time-optimized production of printed circuit boards on an pick-and-place line, wherein the printed circuit boards each have a production cycle time and are divided into groups known as clusters, wherein each cluster is fabricated by means of a setup, wherein the setup is achieved by shuttle tables that are attachable to the pick-and-place lines, which each comprise at least one feed device for providing stores of components, wherein a quantity of shuttle tables necessary per setup is designated as shuttle table set and an empty shuttle table set comprises shuttle tables whose feed devices are empty, under the conditions that
  a setup is temporarily set up on empty shuttle table sets and dismantled after production of printed circuit boards by the assembly thereof, and that
  one of the shuttle table sets can only be used in production if it has been completely set up in a preliminary setup area and the shuttle table set can only be set up again when the production performed with the shuttle table set has ended and the shuttle table set has been dismantled again in the preliminary setup area,
wherein the method comprises the following steps:
a) sensing a quantity of clusters,
b) sensing a number of empty shuttle table sets
c) sensing the respective time for creating the setup for a cluster,
d) sensing a number of printed circuit boards within a cluster,
e) determining the cumulative cycle times of the printed circuit boards within a cluster, wherein the determined result corresponds to the production time for a cluster,
f) selecting an order for using the shuttle table sets for setting up in the preliminary setup area with the aim of avoiding waiting times in production in which these shuttle table sets are used for producing printed circuit boards,
g) setting an order of the printed circuit boards within a cluster in ascending order according to the cycle times of the individual printed circuit boards,
h) optimizing the order of the clusters taking into account the selected order for using the shuttle table sets,
i) wherein the average processing time of the printed circuit boards from all the (sensed) clusters is minimized,
j) carrying out the production of the printed circuit boards with the aid of the set and optimized orders of the printed circuit boards and the clusters thereof.

In order to minimize the average processing times of the printed circuit boards of the clusters, it is sufficient to minimize the sum of the number of printed circuit boards of a cluster multiplied by the starting time of the cluster over all the clusters.

An empty shuttle table set usually comprises non-setup or not-yet setup shuttle tables. The feed devices are empty in this case and not set up with components for assembly.

The shuttle table sets can in this case be assigned to positions in a time sequence in which the shuttle table sets are set up in the preliminary setup area and used or deployed in the same time sequence in the production.

A further development of embodiments of the invention provides that in addition, changeover times are sensed and considered in the production time, which changeover times occur as a result of changing the shuttle table sets on transition from one setup to another setup.

The calculations or optimizations of the aforesaid steps h) and i) are carried out with the aid of mixed integer linear optimization. A possible model for mixed integer linear optimization will be described in detail in the exemplary embodiment explained hereinafter.

Different types of setups can be used, wherein a first type corresponds to a fixed setup, which remains unchanged after setting up once and is not dismantled and set up before production and a shuttle table set is provided per fixed setup, wherein a second type corresponds to a variant setup (V1, . . . V10), and at least one shuttle table set is provided for the variant setups and wherein the printed circuit boards of each cluster are fabricated with a setup of a predefinable type of the said types.

In order to improve the throughput, one or more clusters with fixed setups can be skillfully inserted between the clusters with variant setups in the production. One cluster with a fixed setup can be split and can be introduced multiple times into the order of the clusters. In addition, a cluster with a fixed setup can be introduced into the order of the cluster at the beginning and/or at the end.

A further development of embodiments of the invention provides that in order to minimize the average processing times of the printed circuit boards of the clusters, a cost function is taken into account, wherein the cost function can express inventory costs of printed circuit boards.

Embodiments of the invention bring with it the advantage that not only the throughput but also the processing time in the production of printed circuit boards can be increased. It is possible to make optimal calculations or determination for the above orders with regard to the printed circuit boards within a cluster and with regard to the said positions, with the result that inter alia an automated assistance in the production planning is achieved.

A further aspect of embodiments of the invention is a control device, in particular for the processing-time-optimized production of printed circuit boards (120) on an pick-and-place line (110), wherein the printed circuit boards each have a production cycle time and are divided into groups known as clusters, wherein each cluster (175) is fabricated by means of a setup, wherein the setup can be achieved by shuttle tables (140) that are attachable to the pick-and-place lines, which each comprise at least one feed device (150) for providing stores of components (155), wherein a quantity of shuttle tables necessary per setup is designated as shuttle table set and an empty shuttle table set comprises shuttle tables whose feed devices are empty, under the conditions that a setup is temporarily set up on empty shuttle table sets and can be dismantled after production of printed circuit boards by the assembly thereof, and that one of the shuttle table sets can only be used in production if it has been completely set up in a preliminary setup area and the shuttle table set can only be set up again when the production performed with the shuttle table set has ended and the shuttle table set has been dismantled again in the preliminary setup area, wherein the control unit comprises the following sensing devices:

a) for sensing a quantity of clusters,
b) for sensing a number of empty shuttle table sets
c) for sensing the respective time for creating the setup for a cluster,
d) for sensing a number of printed circuit boards within a cluster, and
e) means for determining the cumulative cycle times of the printed circuit boards within a cluster, wherein the determined result corresponds to the production time for a cluster,
f) means for selecting an order for using the shuttle table sets for setting up in the preliminary setup area with the aim of avoiding waiting times in production in which these shuttle table sets can be used for producing printed circuit boards,
g) means for setting an order of the printed circuit boards within a cluster in ascending order according to the cycle times of the individual printed circuit boards, and
h) means for optimizing the order of the clusters taking into account the selected order for using the shuttle table sets,
i) wherein the average processing time of the printed circuit boards from all the (sensed) clusters is minimized, and
j) means for carrying out the production of the printed circuit boards with the aid of the set and optimized orders of the printed circuit boards and the clusters thereof.

The control device can provide means and/or units or devices and/or modules for carrying out the aforesaid method, which can each be defined in terms of hardware and/or in terms of firmware and/or in terms of software or as a computer program or computer program product (non-transitory computer readable storage medium having instructions, which when executed by a processor, perform actions). These devices or means can be implemented individually by themselves or combined in one or more units.

The control device can be further developed according to the method described above.

A further aspect of embodiments of the invention can be a pick-and-place system which has such a control device according to embodiments of the invention.

This pick-and-place system can be part of an installation.

The installation can, inter alia, be characterized by one of the following types of installations. Examples of this are an automatic installation or a fabrication or production installation.

A further aspect of embodiments of the invention is a computer program product or a computer program with means for carrying out the aforesaid method, when the computer program (product) is executed in an aforesaid control device or in means of the device. The computer program or product can be stored on a computer-readable medium. The computer program or product can be created in a customary program language (e.g. C++, Java). The processing device can comprise a commercially available computer or server with corresponding input, output and memory means. This processing device can be integrated in the control device or in the means thereof.

BRIEF DESCRIPTION

Some of the embodiments will be described in detail, with reference to the following figures, wherein like designations denote like members, wherein.

DETAILED DESCRIPTION

Figure 1:
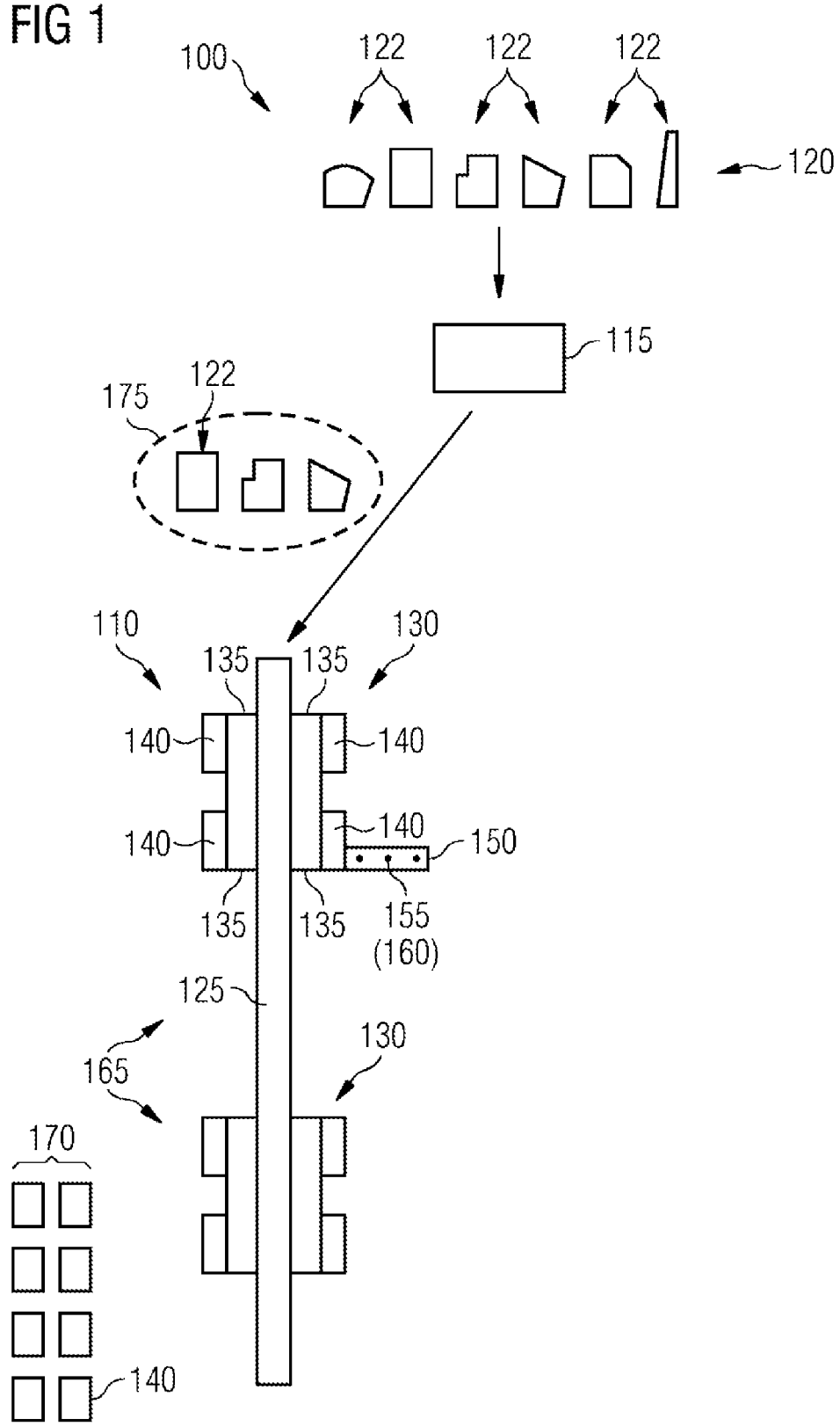
FIG. 1 shows a pick-and-place system for example with a pick-and-place line.

FIG. 1 shows an exemplary pick-and-place system 100. The pick-and-place system 100 comprises a pick-and-place line 110 and a processing or control device 115. Each pick-and-place line 110 comprises an optional transport system 125 as well as one or more automatic pick-and-place machines 130. Each automatic pick-and-place machine 130 comprises one or more pick-and-place heads 135, which are each adapted to receive components 155 from a setup table 140 and position them at a predetermined location on the printed circuit board or assembly 120, which is located on the transport system 125. During the pick-and-place process, the printed circuit board 120 is usually stationary in relation to the automatic pick-and-place machine 130.

The setup tables 140 each comprise a plurality of feed devices 150, of which only one is shown as an example in FIG. 1. Each feed device 150 holds in readiness a supply of components 155 of a predetermined component type 160. For the components 155, the feed device 150 usually has a capacity, which can be expressed in tracks. A track is usually 8 mm wide and the number of tracks of a setup table 140 is limited, for example, to 40. Components 155 of the same component type 160 are usually held in readiness in a belt, on a tray or in a tube. Each component type 160 requires a predetermined number of tracks on the feed device 150 and on the setup table 140, which tracks usually adjoin one another.

Usually a feed device 150 can be configured to hold in readiness components 155 of different component types 160 and usually different feed devices 150 can be attached to a setup table 140. In the present case, it is assumed for simplicity that a supply of components 155 of a component type 160 on a feed device 150 is almost infinitely large so that retrofitting is not necessary.

If a component 155 of a component type 160, which is not present on one of the setup tables 140, is required on the automatic pick-and-place machine 130, usually the assignment of components 155 on one of the attached setup tables 140 is therefore not changed but the setup table 140 is completely exchanged for another suitably equipped setup table 140. The equipping of a setup table 140 not attached to the pick-and-place line 110 with components 155 is known as preliminary setup and can require a processing time in the range of one or several hours, for example, about 6-8 hours.

Since a change of setup tables 140 on the pick-and-place line 110, a so-called setup change, is usually associated with a production standstill, it is desirable to carry out a change of setup tables 140 as infrequently as possible. Since furthermore the setup tables 140 are costly and the changeover of a setup table 140 can be time-consuming and tedious, attempts are also made to form as few setups as possible in order to fabricate a predetermined production quantity of printed circuit boards 120 of predetermined printed circuit board types 122. The production quantity here comprises several printed circuit board types 122, of which in each case one predetermined number of printed circuit boards 120 should be equipped with components 155 of predetermined component types 160. For example, 300 printed circuit boards 120 of a first printed circuit board type 122 and 200 printed circuit boards 120 of a second printed circuit board type 122 can be equipped.

A setup 165, 170 comprises a quantity of component types 160 and is achieved by one or more setup tables 140, which in the case of several setup tables, form a shuttle table set and are each provided with supplies of components 155 of the component types 160 of the setup 165, 170 and are attached to the pick-and-place line 110.

The setup 165, 170 is assigned a setup family 175, which comprises printed circuit board types 122, of which printed circuit boards 120 can be equipped by means of components 155 of the component types 160 of the setup 165, 170. One setup family 175 is assigned to precisely one setup 165, 170 and conversely.

In order to increase the capacity of a pick-and-place line 110 or reduce a requirement for setup tables 140, it is therefore crucial how setup families 175 are formed on the basis of the printed circuit boards types 122 to be equipped. When forming setups 165, 170 or setup families 175, it may be necessary to observe auxiliary conditions, for example, maintaining a limited capacity of a setup table 140 for component types 160 or a grouping of predetermined printed circuit board types 160 in the same setup family 175, possibly for reasons of using lead-containing or lead-free tin solder.

The setups can be distinguished into fixed setups 165 and variant setups 170, wherein a fixed setup 165 is provided to remain set up unchanged on a number of shuttle tables 140 over a predetermined planning period while a shuttle table 140 of a variant setup 170 is prospectively changed over within the planning period with components 155 of different component types 160. The planning period can, for example, be 6 to 12 months. A variant setup 170 consists in a predetermined arrangement usually substantially shorter than the planning period, for example, over several hours or days, but usually not over more than one week.

The setups 165, 170 can be exchanged if required on the pick-and-place line 110. In order to achieve a fixed setup 165 or a variant setup 170, usually a setup table 140, while it is not attached to the pick-and-place line 110, is set up with supplies of components 155 of predetermined component types 160. Components 155 of unrequired component types 160 which have already been set up can be dismantled first. This changeover can comprise a considerable proportion of manual work and can be time-consuming.

In order to minimize the effort associated with a variant setup 170, attempts are made to accommodate as many printed circuit board types 122 as possible in the fixed setups 165. However, a desired case without variant setups 170 is barely achievable in practice.

In the course of the control of the pick-and-place system 100, the control device 115 assigns to one setup family 175 in each case, printed circuit board types 122, whose assigned printed circuit boards 120 are to be equipped on the pick-and-place line 100, wherein fixed-setup setup families 175, which are each assigned to a fixed setup 165, and variant-setup setup families 175, which are each assigned to a variant setup 170, can be formed.

A special case of optimization methods is linear optimization. This is concerned with the optimization of linear target functions over a quantity which is limited by linear equations and inequations. This is the basis of the solution method of (mixed) integer linear optimization. A so-called solver is a collective designation for special mathematical computer programs, which can numerically solve mathematical problems. In connection with MILP (mixed integer linear programing), standard solvers such as, for example, CPLEX, Scip, Gurobi, Xpress can be used for IP programs (integer optimization models).

An example is described hereinafter, in which by means of an MILP model (mixed integer linear programming), the optimal time setup sequences of predefined setup families to be fabricated can be calculated with a minimal average processing time of a printed circuit board. In addition, an optimal time sequence can be calculated for use of the set-up shuttle table sets (variant setup) and optionally of the fixed-setup shuttle table sets on the pick-and-place line.

Furthermore, a sequence of assemblies is specified in ascending order according to their cycle times.

Figure 2:
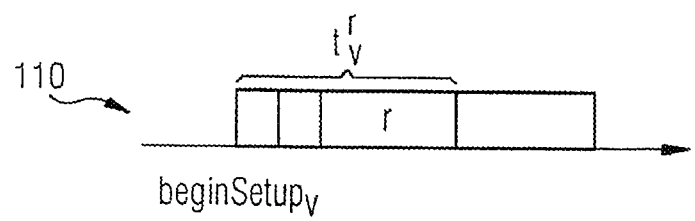
FIG. 2 shows the processing time of an assembly r of the setup family or cluster v.

FIG. 2 shows in pictorial form that the processing time Dlz of an assembly r of the setup family v is $$beginSetup_v + t_v^r$$

Figure 3:
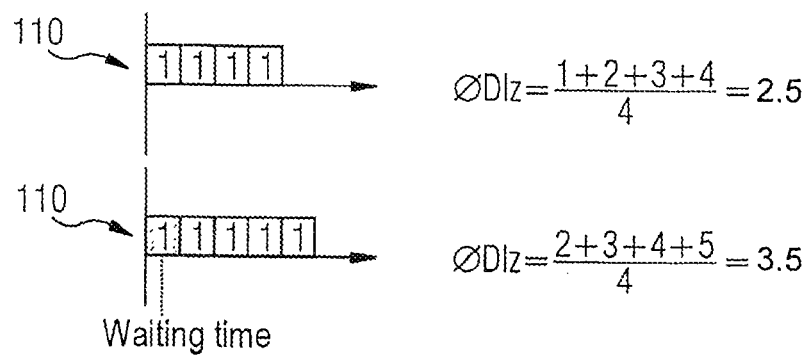
FIG. 3 shows an example that waiting times increase the processing time.

In FIG. 3 it is shown schematically how waiting times can have a negative influence on the processing time. For example, four printed circuit boards with a cycle time of one time unit 1 each are shown on the pick-and-place line 110. The average processing time ØDlz here is 2.5 without waiting time and 3.5 with waiting time.

Figure 4:
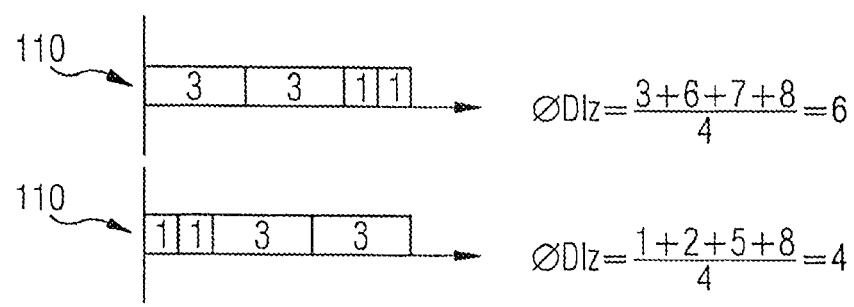
FIG. 4 shows an example for improving the processing time with an assumed constant total throughput.

In FIG. 4 it is shown that for different cycle times of the assemblies, the sequence of the assemblies within a setup family has an effect on the average processing time. In one example it is found that ØDlz=6. In another example and optimized case, it is found that ØDlz=4.

In the formulation of the optimization model in the form of an MILP model, the following designations apply:

Target function:
BeginSetup$_v$ Beginning of fabrication of the setup family v
$t_v^r$ Sum of waiting time of the assembly r after beginning of production of the setup family and cycle time of r The processing time of an assembly r of the setup family v is (see FIG. 2):

$$beginSetup_v + t_v^r$$

If RecipeCount$_v$ is the number of assemblies in the setup family v, the sum of the processing times of all the assemblies of a setup family v is then:

$$sumDlz_v^v = \sum_{r \in v} beginSetup_v + t_v^r = RecipeCount_v beginSetup_v + \sum_{r \in v} t_v^r$$

The last term is a constant for optimization of the production sequence of the setup families. The target function for minimizing the sum of the processing times of the assemblies and therefore also for minimizing the average processing time of the assemblies is as follows:

Minimize $\Sigma_{v \in V}$ RecipeCount$_v$ beginSetup$_v$

Designations:
In the MILP formulation the following designations apply.
Indices
V Quantity of setup families to be fabricated
P P={1, . . . , |V|}, positions for the setup families, in the production sequence
T Quantity of table sets
$P_S$ Quantity of positions classified in ascending order at which table set s∈T is used.
Parameters
$PTime_v$ Production time for the setup family v
$RTime_v$ Time for creating the setup of setup family v
$EarliestBegin_L$ Earliest possible beginning of production on the pick-and-place line
$EarliestBegin_R$ Earliest possible beginning of setup in the preliminary setup area
$EarliestBegin_S$ Earliest possible use for table set s
$RecipeCount_v$ Number of assemblies in the setup family v $M$ $M:=\max\{EarliestBegin_L, EarliestBegin_R, EarliestBegin_S:S\in T\}+\Sigma_{v\in V}(RTime_v+PTime_v)$ Variables
$assign_{v,p}$ Variable which specifies whether the setup family v is produced at the p-th position of the fabrication sequence. (In this case, the variable has the value 1, otherwise the value 0).
$beginP_p$ Beginning of fabrication of the setup family at the p-th position of the fabrication sequence
$beginSetup_v$ Beginning of fabrication of the setup family v
$beginV_p$ . . . Beginning of creation of the setup for the setup family at the p-th position of the fabrication sequence in the preliminary setup area
$endP_p$ End of fabrication of the setup family at the p-th position of the fabrication sequence
$endV_p$ End of creation of the setup for the setup family at the p-th position of the fabrication sequence in the preliminary setup area
IP formulation:
Target function:
Minimize $\Sigma v \in V$ $RecipeCount_v$ $beginSetup_v$
Auxiliary Conditions:
(1) Each setup family must be assigned a position.

$$\sum_{p \in P} assign_{v,p} = 1, v \in V$$

(2) A setup family must be assigned to each position.

$$\sum_{v \in V} assign_{v,p} = 1, p \in P$$

(3) The production of a setup family at position p can only begin when the setup is created in the preliminary setup area.

$endV_p \le beginP_p$ $p \in P$ (4) The setup process for the setup family at position p can only begin when the setup process for the setup family at position p−1 is completed.

$endV_{p-1} \le beginV_p$ $p=2, \ldots, |P|$ (5) The setup process for the setup family at position p in the preliminary setup area can only begin when the assigned shuttle table set is free.

$endP_p \le beginV_p$ $p$ directly follows $p'$ in $P_s$, $s \in T$ (6) Allowance for the production times $$endP_p = beginP_p + \sum_{v \in V} PTime_v assign_{v,p} \; p \in P$$

(7) Allowance for the setup times in the preliminary setup area $$endV_p = beginV_p + \sum_{v \in V} RTime_v assign_{v,p} \; p \in P$$

(8) The production of a setup family at position p can only begin when the production of the setup family at position p−1 is completed $endV_{p-1} \le beginV_p$ $p=2, \ldots, |P|$ (9) The production at the pick-and-place line can initially only begin when the pick-and-place line is available for this.

$EarliestBegin_L \le beginP_1$

(10) The setup creation in the preliminary setup area can initially only begin when the pick-and-place line is available for this.

$EarliestBegin_V \le beginV_1$

(11) The setup creation in the preliminary setup area can initially only begin when the pick-and-place line is available for this.

$EarliestBegin_s \le beginV_p$ $p$ first element in $P_s$

(12) The beginning of production of the setup family v is less than or equal to the beginning of production of the setup family at the ascribed position $beginSetup_v \le beginP_p^L + M(1-assign_{v,p})$ $v \in V, p \in P$

(13) The beginning of production of the setup family v is greater than or equal to the beginning of production of the setup family at the ascribed position $beginSetup_v \ge beginP_p - M(1-assign_{v,p})$ $v \in V, p \in P$

(14) Variable restrictions $assign_{v,p} \in \{0,1\}$ $v \in V, p \in P$ $beginP_p^L \ge 0$ $p \in P$ $beginV_p \ge 0$ $p \in P$ $beginSetup_v \ge 0$ $v \in V$ $endP_p \ge 0$ $p \in P$ $endV_p \ge 0$ $p \in P$ Further Developments/Embodiments:
Guarantee of Throughput Optimality
If the average processing time of the assemblies is minimized, undesired and avoidable waiting times can therefore possibly occur. These can be avoided by determining in a first optimization firstly the minimum fabrication time $T_{min}$ of all the setup families and then including the following restriction in the presented method:

$endP_{|P|} \le T_{min}$

Order Transfer of the Assemblies after the End of Fabrication

If after the end of fabrication of the assemblies, the assemblies are not delivered individually to the next processing station or automatic pick-and-place machines but they wait only until an entire order (consisting of one assembly type and the number of items to be fabricated) is complete, therefore the target function must be modified as follows to minimize the average processing time of an order:

minimize $\Sigma_{v \in V}$ RecipeTypeCount$T_v$ beginSetup$_v$ wherein RecipeTypeCount$_v$ comprises the number of assembly types which are contained in the setup family.

More General Cost Function

The target function can also contain a more general cost function Cost$_v$, by means of which, for example, inventory costs can be depicted more accurately.

minimize $\Sigma_{v \in V}$ Cost$_v$beginSetup$_v$

Allowance for Fixed Setups

Fixed setups and the associated setup families can be integrated in the MILP approach. They can be used as a buffer between the variant setup families in order to avoid downtimes on account of times for the creation of setups being too long.

The following associated extensions are also possible:

Allowance for Changeover Times

Changeover times which occur on changing from one setup to the next setup can also be taken into account in the optimization approach.

Fixed Setup at the End

For the reason described in (1) it is also favorable to fabricate a fixed setup at the end. To this end, a target function component with a small weighting can be included in the minimization target function.

Possible Division of a Fixed Setup

The optimal solution can possibly be further improved if it is assumed that a fixed-setup setup family is not fabricated in one piece but can be divided into several parts, which can then be used as a buffer in each case between variant setup families. Then however, a corresponding changeover time is incurred for each part of the fixed-setup setup family.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method for implementing time-optimized production of printed circuit boards on pick-and-place lines, wherein the printed circuit boards each have a production cycle time and are divided into groups designated as clusters, wherein each cluster is fabricated by a setup, wherein the setup is achieved by shuttle tables that are attachable to the pick-and-place lines, wherein each pick-and-place line comprises at least one feed device for providing stores of components, wherein a quantity of shuttle tables necessary per setup is designated as shuttle table sets, and wherein an empty shuttle table set comprises shuttle tables whose feed devices are empty, under the conditions that a setup is temporarily set up on empty shuttle table sets and dismantled after production of printed circuit boards by assembly thereof, one shuttle table set of the shuttle table sets is used in production only if the one shuttle table set has been completely set up in a preliminary setup area and the one shuttle table set can only be set up again when the production performed with the one shuttle table set has ended and the one shuttle table set has been dismantled in the preliminary setup area, and a quantity of clusters, a number of empty shuttle table sets, a respective time for creating the setup for each cluster, and a number of printed circuit boards within each cluster have been sensed, wherein the method comprises the following steps:

a) determining cumulative production cycle times of the printed circuit boards within each cluster, wherein the determined cumulative production cycle times correspond to a production time for each cluster, b) selecting an order for using the shuttle table sets for setting up in the preliminary setup area in order to avoid waiting times in production in which the shuttle table sets are used for producing the printed circuit boards, c) setting an order of the printed circuit boards within each cluster in ascending order according to the cycle times of the printed circuit boards, d) optimizing an order of the clusters taking into account the selected order for using the shuttle table sets, wherein said optimizing the order of the clusters comprises minimizing the average processing time of the printed circuit boards from all the sensed clusters, e) carrying out the production of the printed circuit boards in accordance with the optimized order of the printed circuit boards and of the clusters.

2. The method as claimed in claim 1, wherein said minimizing the average processing times of the printed circuit boards of the clusters comprises minimizing a sum of the number of printed circuit boards of each cluster multiplied by a starting time of the cluster over all the clusters.

3. The method as claimed in claim 1, wherein changeover times are taken into account in the production time, wherein the changeover times occur as a result of changing the shuttle table sets on transition from one setup to another setup.

4. The method as claimed in claim 1, wherein steps d) and e) are carried out in accordance with mixed integer linear optimization.

5. The method as claimed in claim 1, wherein different types of setups are used, wherein a first type of setup corresponds to a fixed setup which remains unchanged after setting up once and is not dismantled and set up before production and a shuttle table set is provided per fixed setup, wherein a second type of setup corresponds to a variant setup which is variable and at least one shuttle table set is provided for the variant setups, and wherein the printed circuit boards of each cluster are fabricated with a setup of a predefinable type of the types of setups.

6. The method as claimed in claim 5, wherein one cluster with a fixed setup is split and is introduced multiple times into the order of the clusters.

7. The method as claimed in claim 1, wherein said minimizing the average processing times of the printed circuit boards of the clusters comprises utilizing a cost function.

8. The method as claimed in claim 7, wherein the cost function expresses inventory costs of printed circuit boards.

9. A control device for implementing time-optimized production of printed circuit boards on pick-and-place lines, wherein the printed circuit boards each have a production cycle time and are divided into groups designated as clusters, wherein each cluster is fabricated by a setup, wherein the setup is achieved by shuttle tables that are attachable to the pick-and-place lines, wherein each pick-and-place line comprises at least one feed device for providing stores of components, wherein a quantity of shuttle tables necessary per setup is designated as shuttle table sets, and wherein an empty shuttle table set comprises shuttle tables whose feed devices are empty, under the conditions that a setup is temporarily set up on empty shuttle table sets and dismantled after production of printed circuit boards by assembly thereof, one shuttle table set of the shuttle table sets is used in production only if the one shuttle table set has been completely set up in a preliminary setup area and the one shuttle table set can only be set up again when the production performed with the one shuttle table set has ended and the one shuttle table set has been dismantled in the preliminary setup area, and a quantity of clusters, a number of empty shuttle table sets, a respective time for creating the setup for each cluster, and a number of printed circuit boards within each cluster have been sensed, wherein the control device comprises:

a) means for determining cumulative production cycle times of the printed circuit boards within each cluster, wherein the determined cumulative production cycle times correspond to a production time for each cluster, b) means for selecting an order for using the shuttle table sets for setting up in the preliminary setup area in order to avoid waiting times in production in which the shuttle table sets are used for producing the printed circuit boards, c) means for setting an order of the printed circuit boards within each cluster in ascending order according to the cycle times of the printed circuit boards, d) means for optimizing an order of the clusters taking into account the selected order for using the shuttle table sets, wherein said means for optimizing the order of the clusters comprises means for minimizing the average processing time of the printed circuit boards from all the sensed clusters, e) means for carrying out the production of the printed circuit boards in accordance with the optimized order of the printed circuit boards and of the clusters.

10. The control device as claimed in claim 1, wherein said means for minimizing the average processing times of the printed circuit boards of the clusters comprises means for minimizing a sum of the number of printed circuit boards of each cluster multiplied by a starting time of the cluster over all the clusters.

11. The control device as claimed in claim 1, wherein changeover times are taken into account in the production time, wherein the changeover times occur as a result of changing the shuttle table sets on transition from one setup to another setup.

12. The control device as claimed in claim 9, wherein the means from steps d) and e) are configured by means for mixed integer linear optimization.

13. The control device as claimed in claim 9, wherein different types of setups are used, wherein a first type of setup corresponds to a fixed setup which remains unchanged after setting up once and is not dismantled and set up before production and a shuttle table set is provided per fixed setup, wherein a second type of setup corresponds to a variant setup which is variable and at least one shuttle table set is provided for the variant setups, and wherein the printed circuit boards of each cluster are fabricated with a setup of a predefinable type of the types of setups.

14. A computer program product, comprising a computer readable hardware storage device having computer readable program code stored therein, said program code executable by a processor of a computer system to implement a method for implementing time-optimized production of printed circuit boards on pick-and-place lines, wherein the printed circuit boards each have a production cycle time and are divided into groups designated as clusters, wherein each cluster is fabricated by a setup, wherein the setup is achieved by shuttle tables that are attachable to the pick-and-place lines, wherein each pick-and-place line comprises at least one feed device for providing stores of components, wherein a quantity of shuttle tables necessary per setup is designated as shuttle table sets, and wherein an empty shuttle table set comprises shuttle tables whose feed devices are empty, under the conditions that a setup is temporarily set up on empty shuttle table sets and dismantled after production of printed circuit boards by assembly thereof, one shuttle table set of the shuttle table sets is used in production only if the one shuttle table set has been completely set up in a preliminary setup area and the one shuttle table set can only be set up again when the production performed with the one shuttle table set has ended and the one shuttle table set has been dismantled in the preliminary setup area, and a quantity of clusters, a number of empty shuttle table sets, a respective time for creating the setup for each cluster, and a number of printed circuit boards within each cluster have been sensed, wherein the method comprises the following steps:

a) determining cumulative production cycle times of the printed circuit boards within each cluster, wherein the determined cumulative production cycle times correspond to a production time for each cluster, b) selecting an order for using the shuttle table sets for setting up in the preliminary setup area in order to avoid waiting times in production in which the shuttle table sets are used for producing the printed circuit boards, c) setting an order of the printed circuit boards within each cluster in ascending order according to the cycle times of the printed circuit boards, d) optimizing an order of the clusters taking into account the selected order for using the shuttle table sets, wherein said optimizing the order of the clusters comprises minimizing the average processing time of the printed circuit boards from all the sensed clusters, e) carrying out the production of the printed circuit boards in accordance with the optimized order of the printed circuit boards and of the clusters.

15. The computer program product as claimed in claim 14, wherein said minimizing the average processing times of the printed circuit boards of the clusters comprises minimizing a sum of the number of printed circuit boards of each cluster multiplied by a starting time of the cluster over all the clusters.

16. The computer program product as claimed in claim 14, wherein changeover times are taken into account in the production time, wherein the changeover times occur as a result of changing the shuttle table sets on transition from one setup to another setup.

17. The computer program product as claimed in claim 14, wherein steps d) and e) are carried out in accordance with mixed integer linear optimization.

18. The computer program product as claimed in claim 14, wherein different types of setups are used, wherein a first type of setup corresponds to a fixed setup which remains unchanged after setting up once and is not dismantled and set up before production and a shuttle table set is provided per fixed setup, wherein a second type of setup corresponds to a variant setup which is variable and at least one shuttle table set is provided for the variant setups, and wherein the printed circuit boards of each cluster are fabricated with a setup of a predefinable type of the types of setups.

19. The computer program product as claimed in claim 18, wherein one cluster with a fixed setup is split and is introduced multiple times into the order of the clusters.

20. The computer program product as claimed in claim 14, wherein said minimizing the average processing times of the printed circuit boards of the clusters comprises utilizing a cost function.

* * * * *